(12) United States Patent
Andideh

(10) Patent No.: US 6,437,444 B2
(45) Date of Patent: Aug. 20, 2002

(54) INTERLAYER DIELECTRIC WITH A COMPOSITE DIELECTRIC STACK

(75) Inventor: Ebrahim Andideh, Portland, OR (US)

(73) Assignee: Intel Corporation, Santa Clara, CA (US)

(*) Notice: Subject to any disclaimer, the term of this patent is extended or adjusted under 35 U.S.C. 154(b) by 6 days.

(21) Appl. No.: 09/726,504

(22) Filed: Nov. 29, 2000

Related U.S. Application Data

(62) Division of application No. 09/305,147, filed on May 4, 1999, now Pat. No. 6,191,050, which is a continuation of application No. 08/772,012, filed on Dec. 19, 1996, now Pat. No. 5,953,635.

(51) Int. Cl.[7] .............................................. H01L 23/48
(52) U.S. Cl. .................. 257/760; 257/758; 438/761
(58) Field of Search .................. 438/624, 675, 438/386, 783, 253; 257/752, 703, 700, 758, 750, 701, 753, 760, 759

(56) References Cited

U.S. PATENT DOCUMENTS

| 4,510,678 A |   | 4/1985  | Eggers        |
|-------------|---|---------|---------------|
| 4,966,865 A | * | 10/1990 | Welch et al.  |
| 5,004,704 A | * | 4/1991  | Maeda et al.  |
| 5,064,683 A |   | 11/1991 | Poon et al.   |
| 5,188,987 A |   | 2/1993  | Ogino         |
| 5,244,837 A |   | 9/1993  | Dennison      |
| 5,268,330 A |   | 12/1993 | Givens et al. |
| 5,270,264 A |   | 12/1993 | Andideh et al.|
| 5,340,370 A |   | 8/1994  | Cadien et al. |
| 5,457,073 A |   | 10/1995 | Ouellet       |
| 5,496,774 A |   | 3/1996  | Pramanik et al.|
| 5,510,652 A |   | 4/1996  | Burke et al.  |
| 5,516,729 A |   | 5/1996  | Dawson et al. |
| 5,670,410 A |   | 9/1997  | Pan           |
| 5,679,590 A | * | 10/1997 | Mori et al.   |
| 5,763,305 A |   | 6/1998  | Chao          |
| 5,773,361 A |   | 6/1998  | Cronin et al. |
| 5,858,876 A |   | 1/1999  | Chew          |

OTHER PUBLICATIONS

Modrean, Cosmin, Cosmin, Cobianu, and Dunare, "Measurement of CVD Thin Films by Sample Weighing Method," International Semiconductor Conference 1996, IEEE, vol. 2, p.409–412.*

* cited by examiner

Primary Examiner—Nathan Flynn
Assistant Examiner—Kevin Quinto
(74) Attorney, Agent, or Firm—Blakely, Sokoloff, Taylor & Zafman LLP

(57) ABSTRACT

A method of forming an interlayer dielectric on a semiconductor device is disclosed. First, a phosphorous doped oxide layer is deposited on the semiconductor device to fill gaps and provide phosphorous for gettering. Then, an undoped oxide layer is deposited and planarized using chemical mechanical polishing (CMP). The undoped oxide layer is denser than the phosphorous doped oxide layer, so the undoped oxide layer can be polished more uniformly than the phosphorous doped oxide layer and can serve as a polish stop for a subsequent tungsten plug polish. Also, the denser undoped oxide layer serves as a more effective moisture barrier than the doped oxide layer. Overall fabrication process complexity can be reduced by performing both oxide depositions in a single operation with no intervening densification or CMP steps.

6 Claims, 20 Drawing Sheets

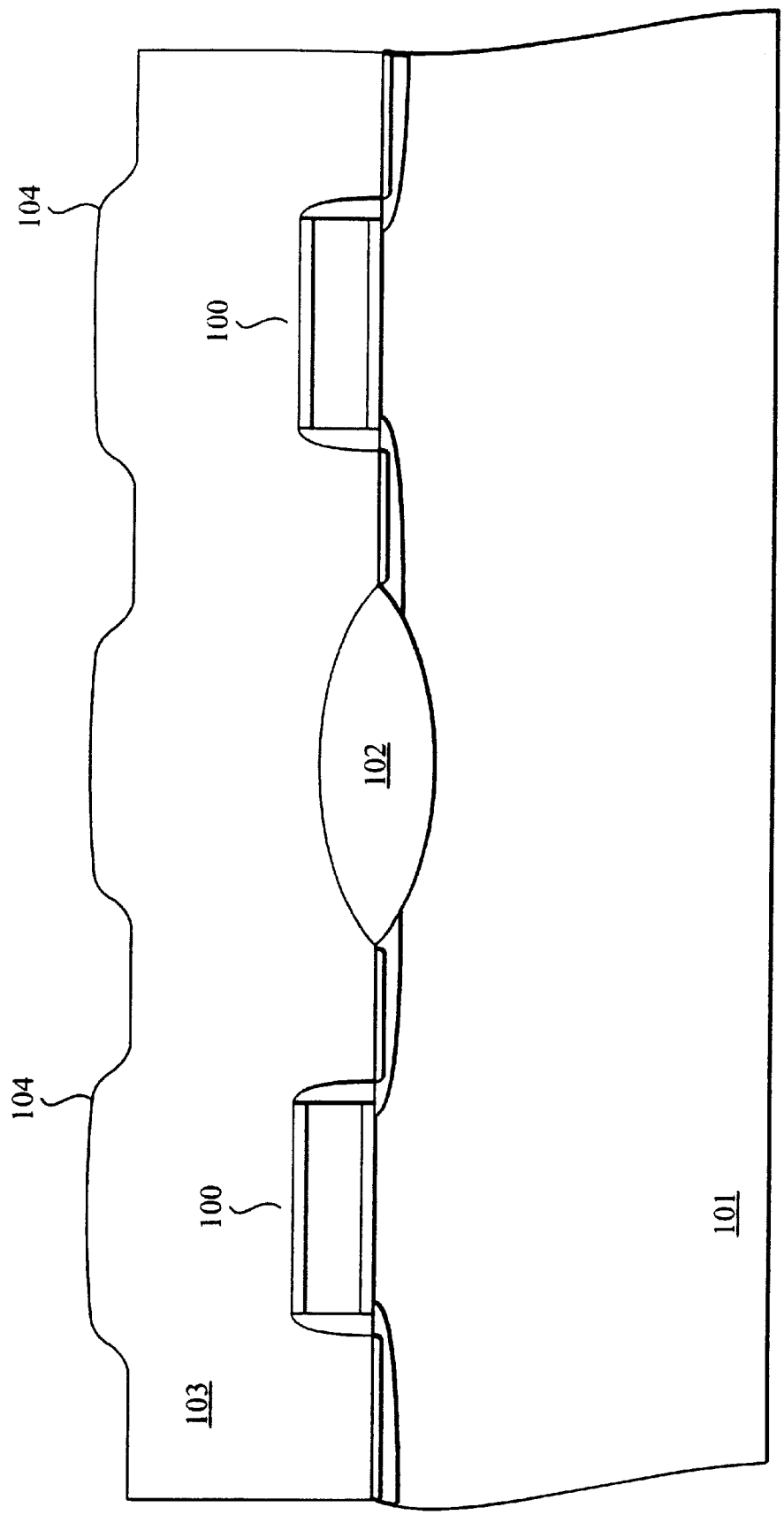

INTERLAYER DIELECTRIC WITH A COMPOSITE DIELECTRIC STACK

This is a Divisional application of Ser. No.: 09/305,147, filed May 4, 1999" now U.S. Pat. No. 6,191,050, which is a Continuation of 08/772,012 filed Dec. 19, 1996, now U.S. Pat. No. 5,953,635.

FIELD OF THE INVENTION

The present invention relates to the field of semiconductor processing and more particularly to a method of forming an interlayer dielectric in an integrated circuit.

BACKGROUND OF THE INVENTION

One prior method of forming an interlayer dielectric (ILD) in an integrated circuit, described in the pending U.S. patent application entitled "Capped Interlayer Dielectric for Chemical Mechanical Polishing", with Ser. No. 08/536,007 and assigned to the present assignee, is illustrated in FIGS. 1a through 1h. FIG. 1a is an illustration of a cross sectional view of semiconductor devices 100 formed on silicon substrate 101 and isolated from each other by field oxide region 102.

FIG. 1b shows the substrate of FIG. 1a covered by phosphosilicate glass (PSG) 103, or alternatively, a borophosphosilicate glass layer. PSG layer 103 is formed with a conventional deposition technique that exhibits superior gap filling ability, such as atmospheric or subatmospheric chemical vapor deposition.

As shown in FIG. 1b, the top surface 104 of PSG layer 103 is nonplanar due to the underlying topography created by devices 100 and filed field oxide regions 102. Therefore, the top surface 104 of PSG layer 103 is planarized by chemical mechanical polishing (CMP) to create planar top surface 105 of PSG layer 103 as shown in FIG. 1c. Since CMP removes denser layers slower than less dense layers, PSG layer 103 is densified prior to the CMP step to reduce the removal rate, thereby increasing process controllability. Also, the thickness of PSG layer 103 as deposited is much greater than the post CMP thickness to provide a large margin for variation in the CMP process. Typical thicknesses of PSG layer 103 are 18,000 A as deposited and 4,500 A post CMP.

FIG. 1d shows the substrate of FIG. 1c after cap layer 106 is deposited over planarized PSG layer 103. Cap layer 106 is an undoped oxide layer formed by plasma enhanced chemical vapor deposition with tetraethyl orthosilicate as the silicon source. Cap layer 106 is denser than PSG layer 103, which allows cap layer 106 to serve as moisture barrier and a polish stop for a subsequent tungsten CMP step involved in forming tungsten plugs. Also, cap layer 106 is thinner than PSG layer 103, approximately 2,000 A compared to 4,500 A.

FIG. 1e shows the substrate of FIG. 1d after openings 107 have been formed through cap layer 106 and PSG layer 103 to prepare for making electrical contact to underlying devices 100. FIG. 1f shows the substrate of FIG. 1e after plug layer 108 has been deposited, filling openings 107. Plug layer 108 is tungsten over a composite adhesion layer of titanium nitride over titanium. FIG. 1g shows the substrate of FIG. 1f after plug layer 108 has been polished to form plugs 109. Finally, FIG. 1h shows the substrate of FIG. 1g after metal interconnects 110 are formed on cap layer 106.

Although this prior method of forming a PSG ILD is compatible with a CMP plug process, the ILD process is more complex than that of a single layer ILD. Therefore, what is desired is a less complex method for forming a PSG ILD layer that is compatible with a CMP plug process.

SUMMARY OF THE INVENTION

A method of forming an interlayer dielectric on a semiconductor device is disclosed. First, an insulating layer comprising phosphorous is deposited on the semiconductor device. Then, another insulating layer which is denser than the first insulating layer is deposited. Finally, the planarity of the second insulating layer is increased using chemical mechanical polishing.

BRIEF DESCRIPTION OF THE DRAWINGS

FIG. 1b shows the substrate of FIG. 1a after deposition of a PSG layer.

DETAILED DESCRIPTION OF A PREFERRED EMBODIMENT

A method of forming an interlayer dielectric (ILD) on a semiconductor device is described. In the following description, numerous specific details are set forth in order to provide a thorough understanding of the present invention. It will be obvious, however, to one skilled in the art that the present invention can be practiced without these specific details. In other instances, some details have been omitted in order to avoid obscuring the present invention.

Figure 1A:
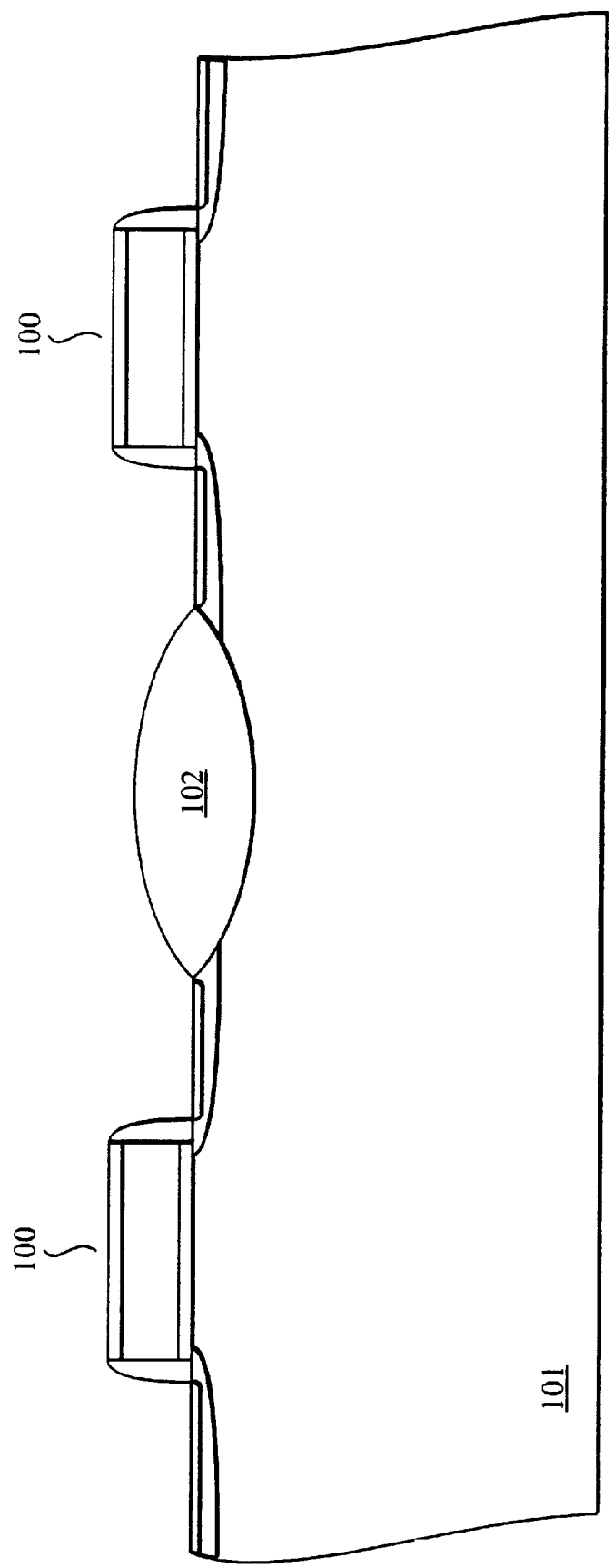
FIG. 1a is an illustration of a cross sectional view of a semiconductor devices on a silicon substrate.
Figure 1C:
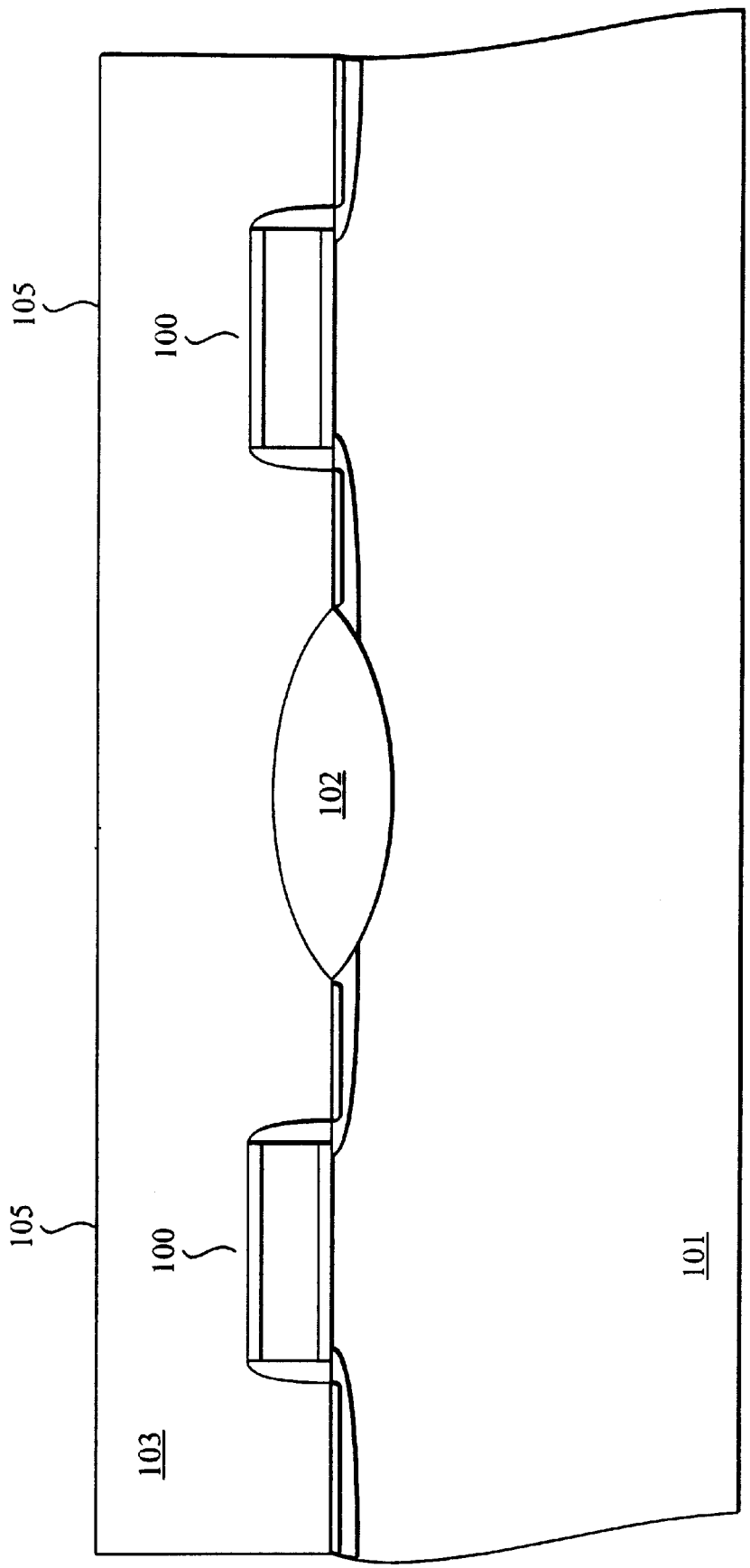
FIG. 1c shows the substrate of FIG. 1b after planarization.
Figure 1D:
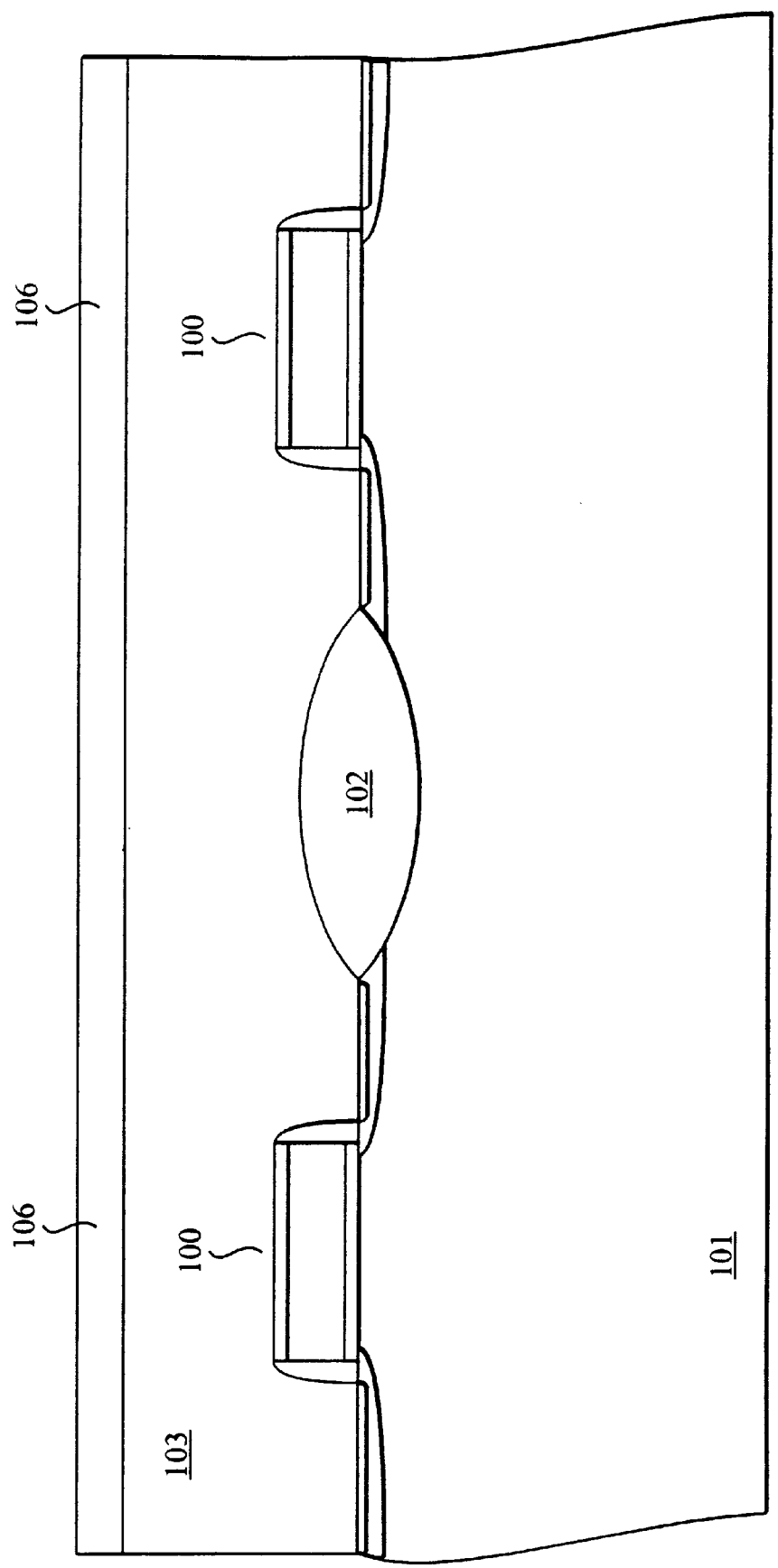
FIG. 1d shows the substrate of FIG. 1c after deposition of a cap layer.
Figure 1E:
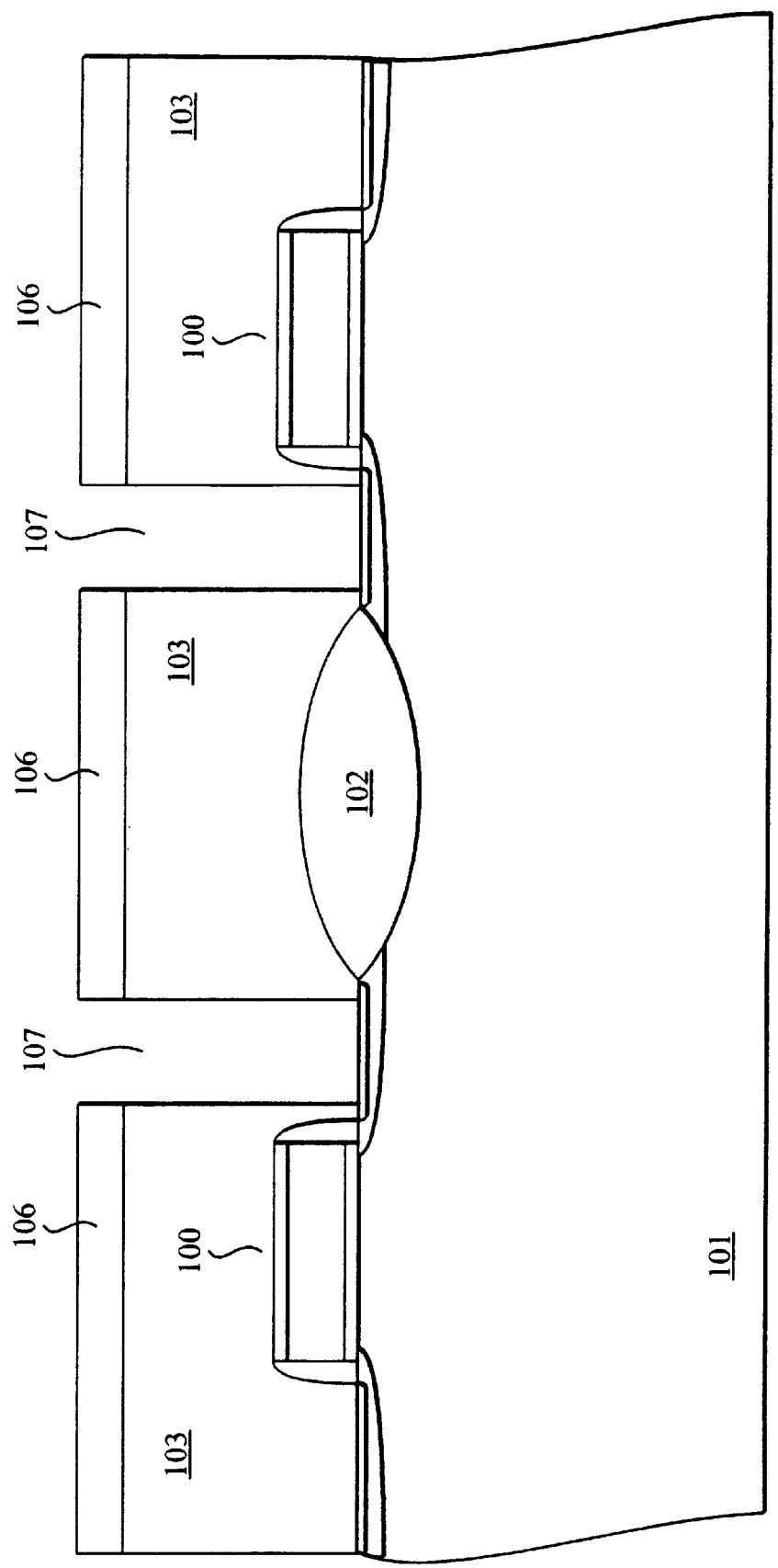
FIG. 1e shows the substrate of FIG. 1d after openings have been formed in the cap and PSG layers.
Figure 1F:
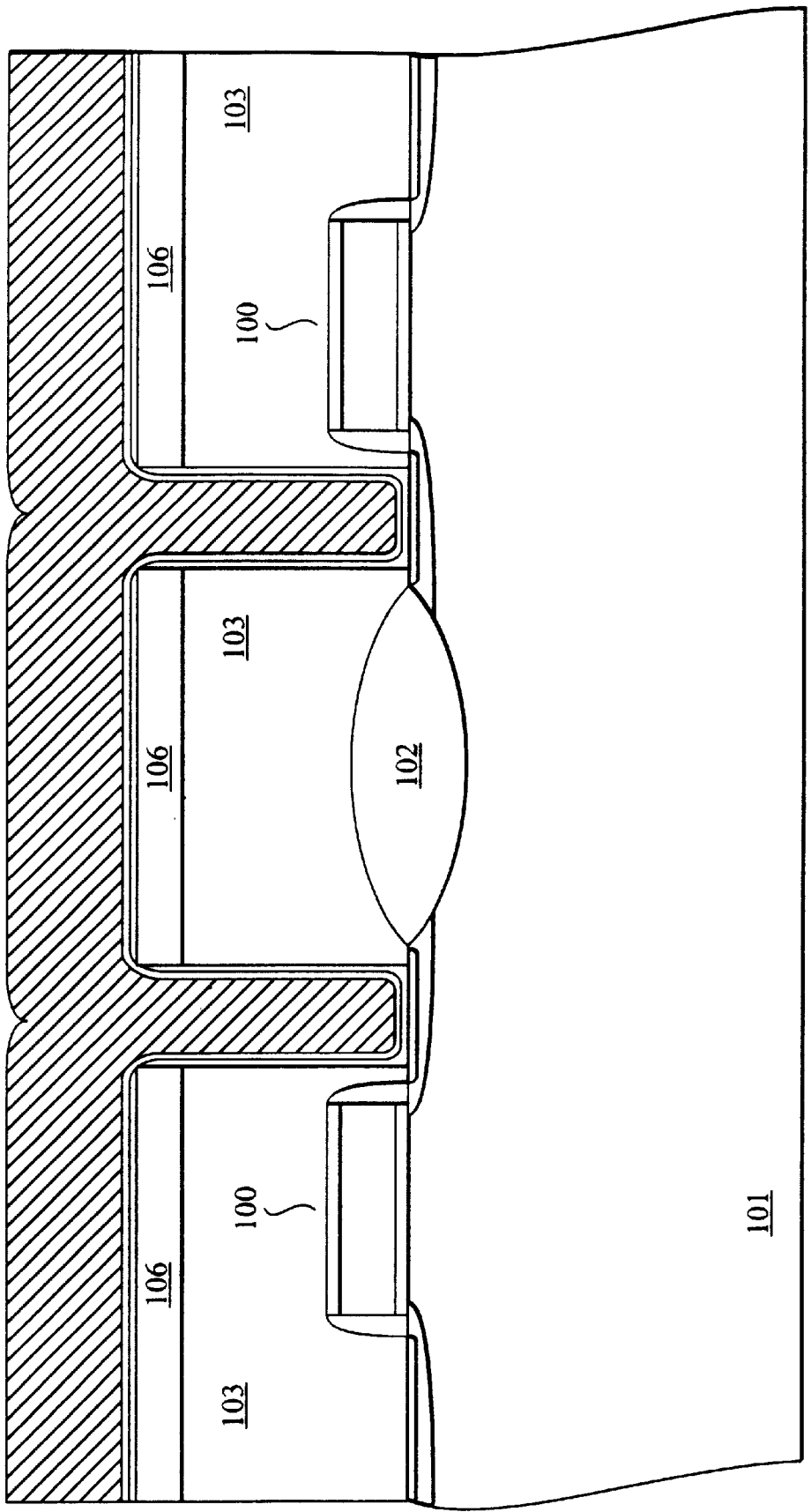
FIG. 1f shows the substrate of FIG. 1e after deposition of a plug layer.
Figure 1G:
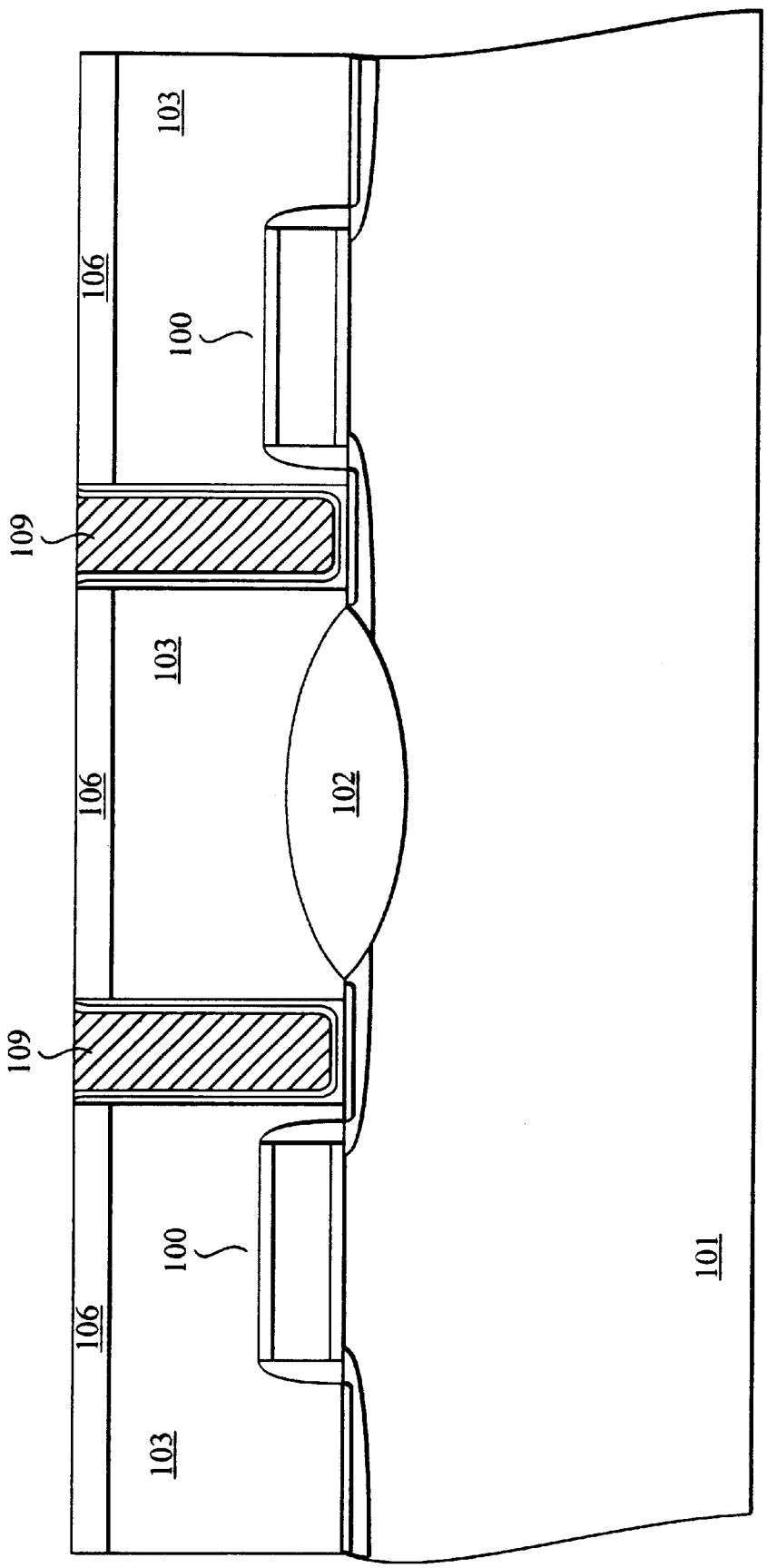
FIG. 1g shows the substrate of FIG. 1f after after plugs have been formed by polishing the plug layer.
Figure 1H:
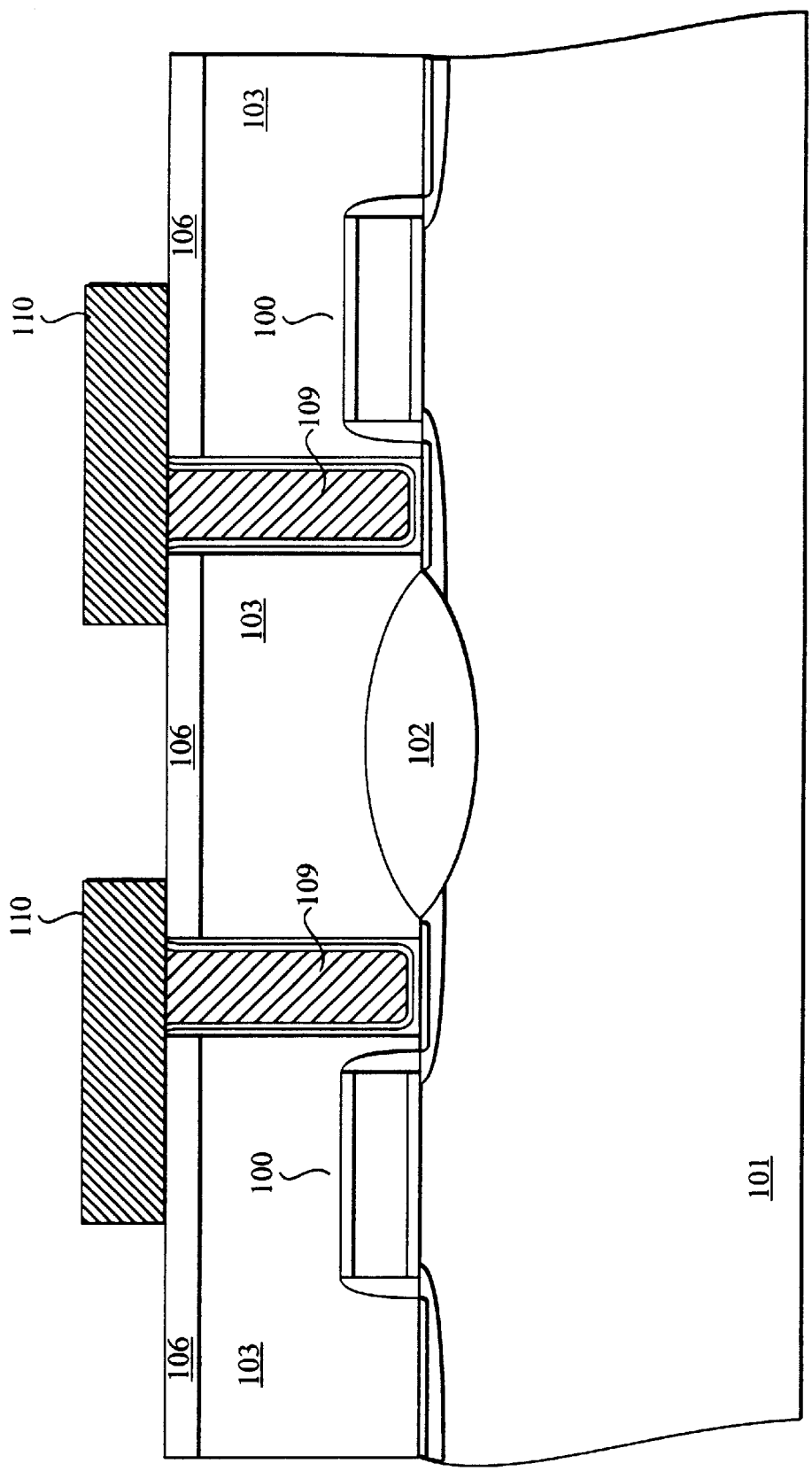
FIG. 1h shows the substrate of FIG. 1g after interconnects have been formed.
Figure 2:
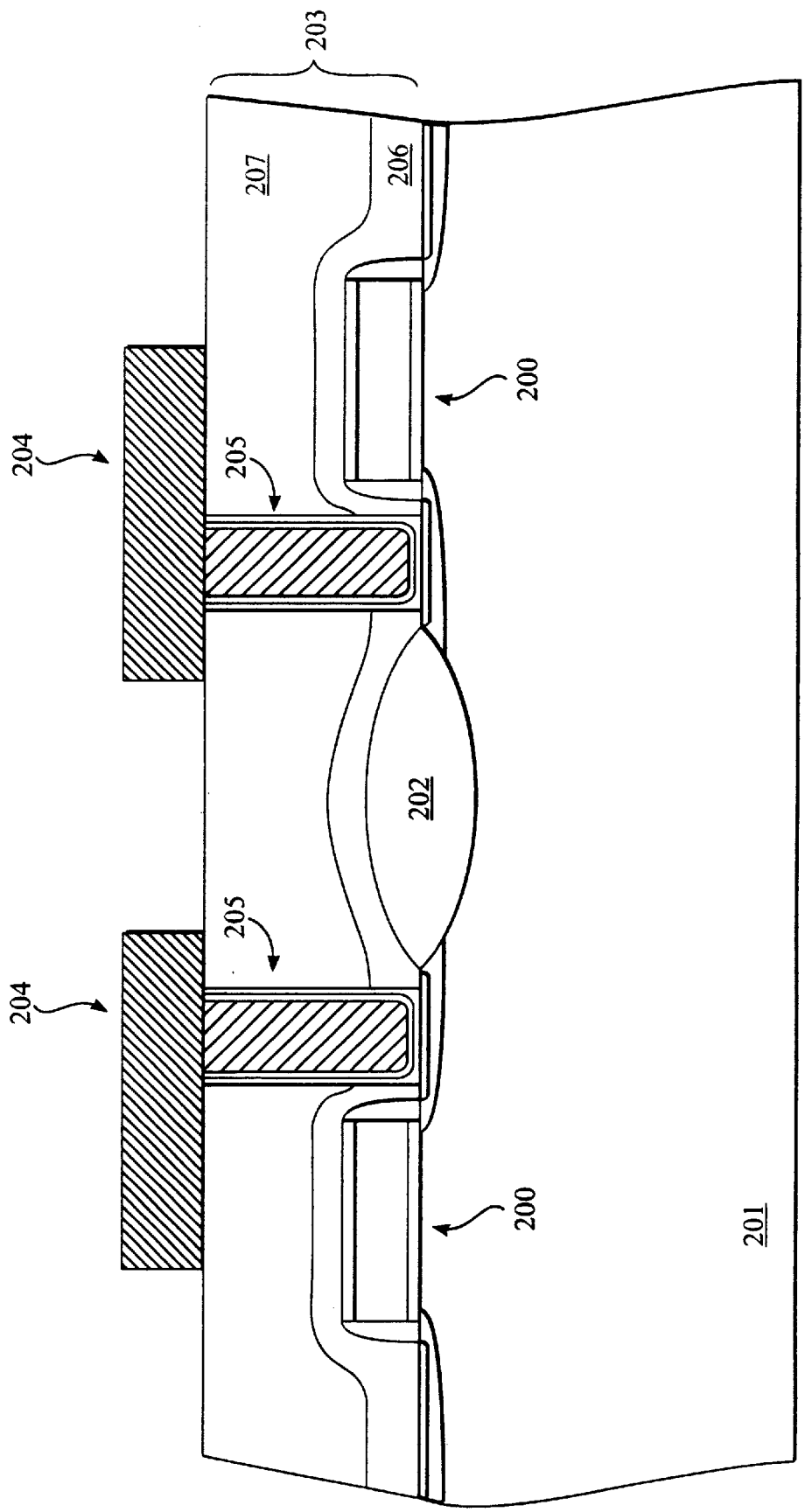
FIG. 2 is an illustration of a cross sectional view of of high density integrated circuit containing interconnected semiconductor devices with the interconnect layer isolated from the device layer by an ILD formed with one embodiment of the present invention.

FIG. 2 is an illustration of a cross sectional view of a high density integrated circuit having a semiconductor device layer isolated from an interconnect layer by an ILD formed with one embodiment of the present invention. Semiconductor devices 200 on silicon substrate 201 are isolated from each other by field oxide region 202. ILD 203 lies above devices 200 and below interconnect 204. Plugs 205 penetrate ILD 203 to provide electrical contact between devices 200 and interconnects 204.

Two layers of insulating material form ILD 203. Bottom insulating layer 206 is doped with phosphorous to getter moisture and mobile ions from the vicinity of devices 200. Top insulating layer 207 is denser than bottom insulating layer 206 to allow top layer 207 to serve as an etch stop during a chemical mechanical polish (CMP) step in which plugs 205 are formed. No CMP step is needed between the deposition of the bottom insulating layer and the top insulating layer, providing a number of possibilities for decreasing process complexity. First, the step of densifying the bottom insulating layer can be eliminated. Second, the two ILD layers can be deposited in the same equipment without removal from the equipment for an intervening CMP step. Third, instead of planarizing the bottom insulating layer with a unique CMP process, the top insulating layer can be planarized with the same CMP process that is used for other ILDs within the same fabrication flow.

Figure 3:
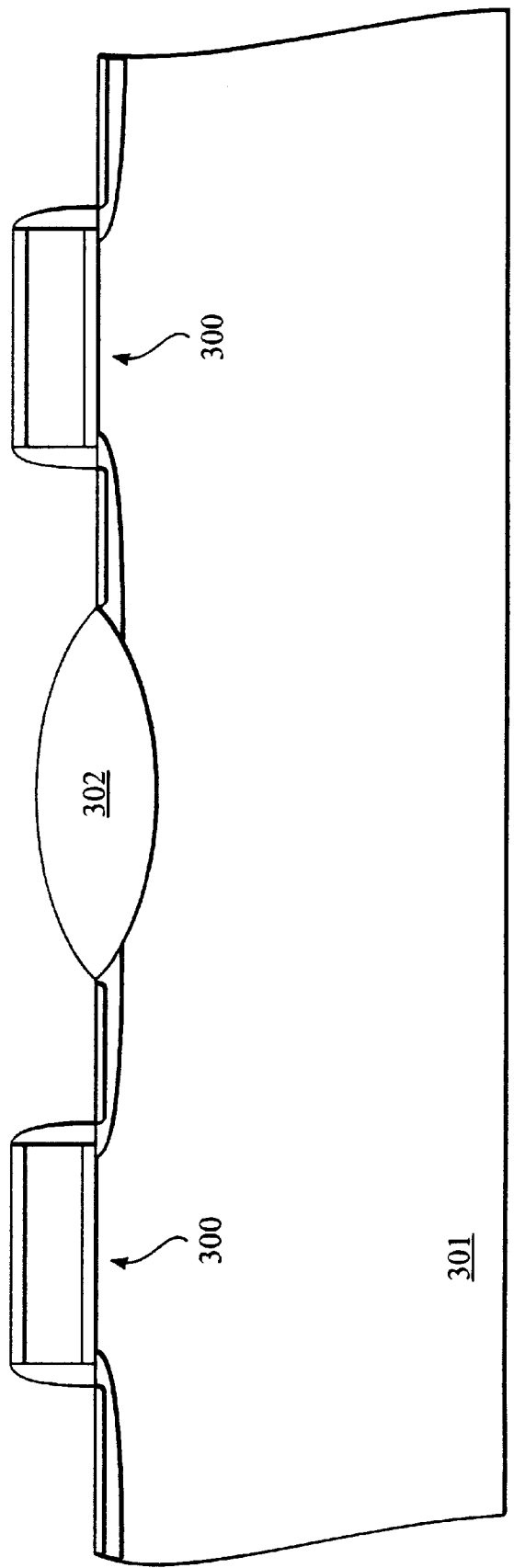
FIG. 3 is an illustration of a cross sectional view of semiconductor devices on a silicon substrate.

One fabrication process embodying the present invention is illustrated in FIGS. 3 through 12. This process description begins after semiconductor devices 300 have been formed on a semiconductor substrate 301 as shown in FIG. 3. In this illustration devices 300 are metal oxide semiconductor transistors isolated from each other by field oxide regions 302. However, substrate 301 may contain other completed or partially completed active or passive devices such as, but not limited to, bipolar transistors, thin film transistors, capacitors, and resistors. Also, the present invention can be used to isolate one interconnect layer from another, in which case semiconductor devices 300 would already be covered with at least one insulating layer and at least one interconnect layer at the point at which this process description begins. If desired, the device layer can be covered with a thin (less than 2,000 A) layer of silicon nitride ($Si_3N_4$) to block moisture and dopants from reaching the devices.

Figure 4:
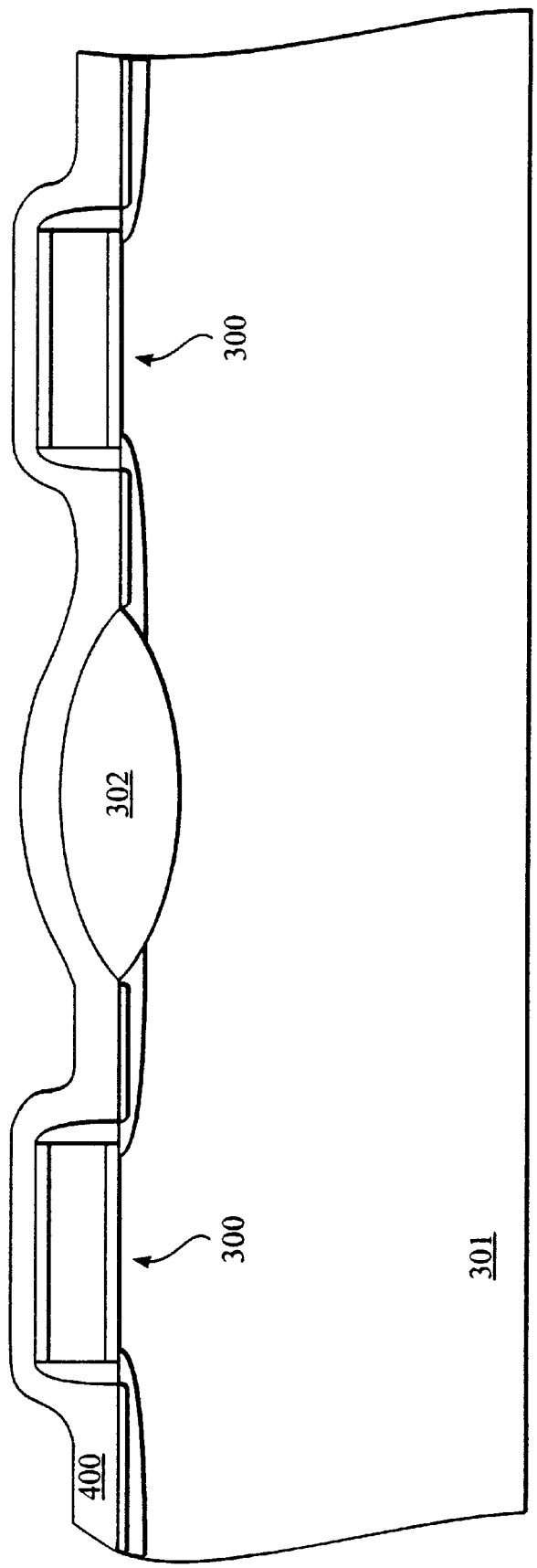
FIG. 4 shows the substrate of FIG. 3 after a bottom insulating layer has been formed according to one embodiment of the present invention.

The first step in this exemplary process is the formation of bottom insulating layer 400 shown in FIG. 4. Bottom insulating layer is doped with phosphorous to getter moisture and mobile ions in the vicinity of the devices. For that purpose the preferred amount of phosphorous is at least one percent by weight. However, excess phosphorous can lead to the formation of phosphoric acid which can cause corrosion. Therefore, the preferred amount of phosphorous is at most eight percent by weight. Bottom insulating layer 400 can also be doped with boron if desired, to exploit the tendency of boron doped films to fill narrow gaps between devices better than films without boron.

Figure 5A:
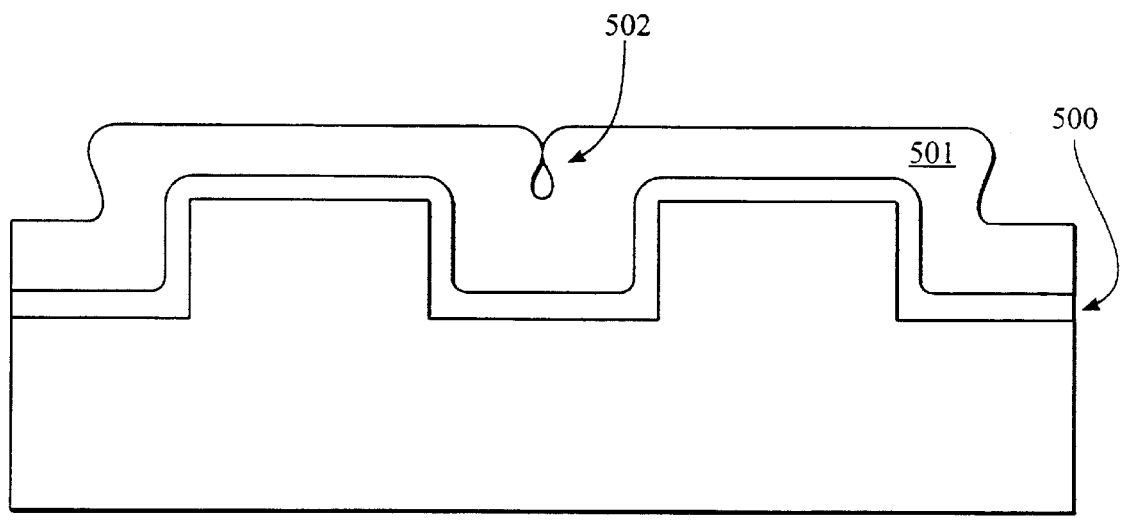
FIG. 5a depicts the undesired effect of a bottom insulating layer that is too thin.
Figure 5B:
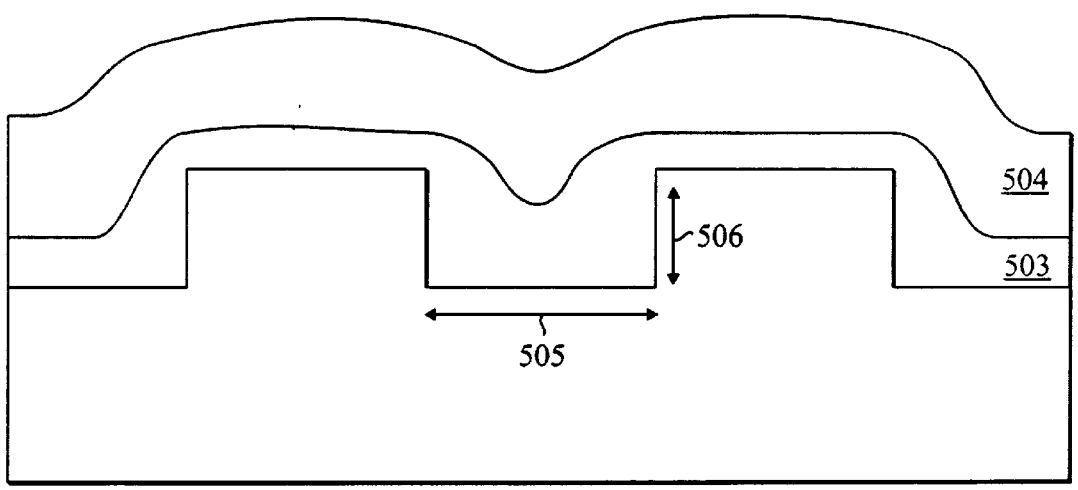
FIG. 5b depicts the desired effect of a bottom insulating layer that is sufficiently thick.

Bottom insulating layer 400 is thick enough to provide enough phosphorous to effectively getter moisture and mobile ions. Bottom insulating layer 400 is also thick enough to fill narrow gaps between devices to an extent such that the subsequent deposition of a nonconformal top insulating layer will not result in the formation of voids. This criteria is illustrated in FIGS. 5a and 5b. FIG. 5a shows the undesired effect of a bottom insulating layer 500 that is too thin to prevent the nonconformal deposition of top insulating layer 501 from forming void 502. Void 502 is undesirable because it can serve as a pocket for moisture and contaminants, and can provide a seam in which subsequent etch steps can proceed uncontrollably in an undesired direction. FIG. 5b shows the desired effect of a bottom insulating layer 503 that is sufficiently thick to fill the gap to an extent that the nonconformal deposition of top insulating layer 504 does not form a void. The requisite thickness of bottom insulating layer 502 depends on the width 505 of the gap and the depth 506 of the gap. To sufficiently fill gaps with widths and heights of approximately one micron, the preferred thickness of bottom insulating layer 400 is at least 100 A.

On the other hand, the preferred thickness of bottom insulating layer 400 is at most 5,000 A, primarily driven by the desire to capitalize on one advantage of the present invention, that is, the elimination of the CMP of bottom layer 400 and the associated need to provide a large margin for variation in that CMP step. The ability to reduce the as deposited thickness of bottom insulating layer 400 reduces processing time, material cost, and potential for processing variation and error.

Bottom insulating layer 400 can be formed from any insulating material, such as an oxide. In one embodiment bottom insulating layer 400 is a phosphorous doped silicon dioxide ($SiO_2$) film formed by any of a variety of well known chemical vapor deposition (CVD) techniques. These techniques include CVD using silane ($SiH_4$) or tetraethyl orthosilicate (TEOS) as a silicon source, CVD at atmospheric or subatmospheric pressures, and CVD with reactions that are thermally or chemically activated or plasma enhanced. Some of the factors to consider in the selection of the deposition technique are the deposition rate and the gap filling ability, the quality, the adhesive ability, and the stress characteristics of the resulting film. One advantage of the present invention is that because there is no requirement that bottom insulating layer 400 be thick enough to provide margin for a CMP step, the factors of deposition rate and gap filling ability become less important, allowing more weight to be placed on the remaining factors.

Figure 6A:
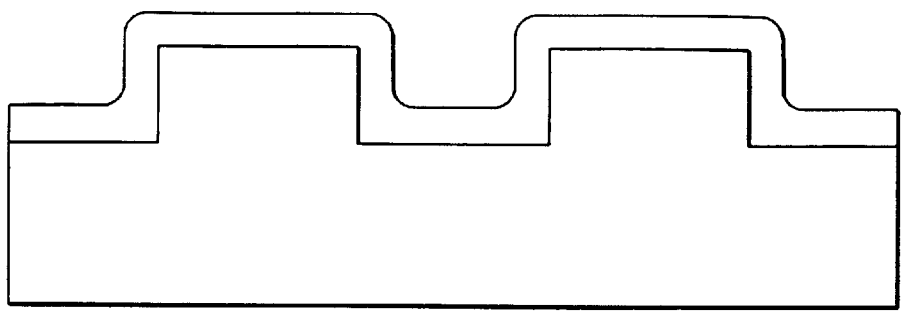
FIG. 6a depicts the gap filling ability of an SACVD film.
Figure 6B:
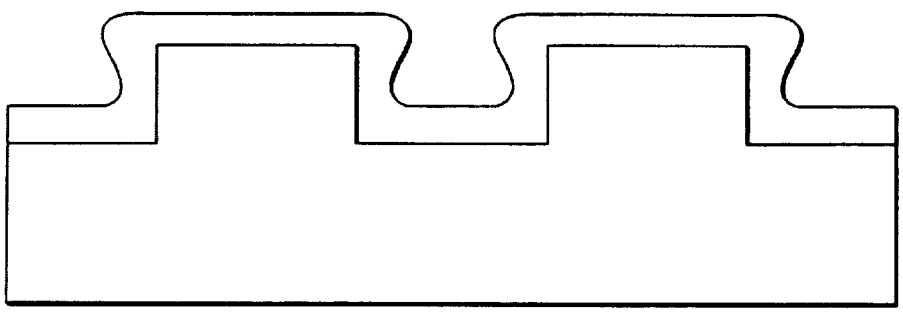
FIG. 6b depicts the gap filling ability of a PECVD film.
Figure 6C:
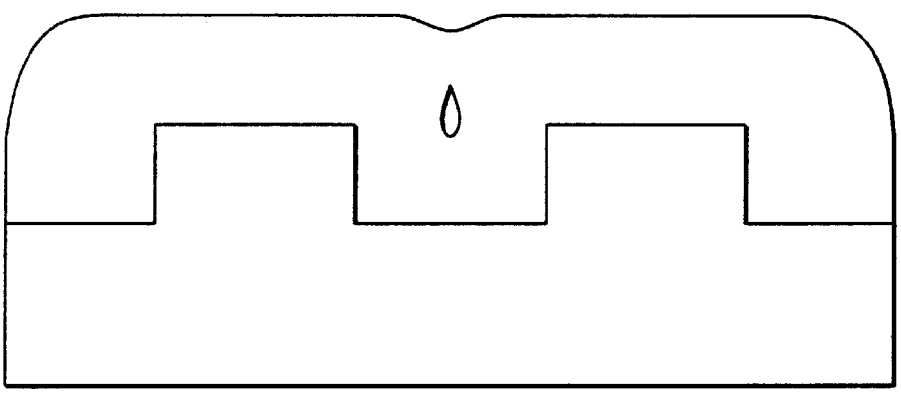
FIG. 6c shows a void formed because of the inferior gap filling ability of a PECVD film.

For example, compare the gap filling ability of a thermally activated subatmospheric CVD (SACVD) film, as illustrated in FIG. 6a, to that of a plasma enhanced CVD (PECVD) film, as illustrated in FIG. 6b. If the inferior gap filling ability of a PECVD film causes void formation when the film thickness is 10,000 A, as shown in FIG. 6c, the advantages of a PECVD film, such as its superior quality, adhesive ability, and compressive stress characteristics cannot be realized. In contrast, the present invention allows for the use of a PECVD film because bottom insulating layer 400 can be thin enough such that the top of the gap is not closed, so that despite the breadloafing effect shown in FIG. 6b, voids are not formed. Advanced PECVD techniques such as dual frequency PECVD or high density plasma CVD techniques can be used to provide a denser, more conformal film with a lower dielectric constant.

Figure 6D:
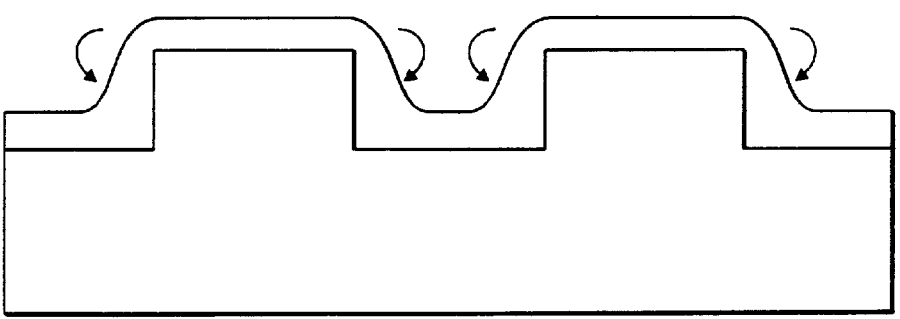
FIG. 6d shows the substrate of FIG. 6b after an argon sputter etch.

To prevent the breadloafing effect as shown in FIG. 6b from causing voids to form in the subsequently deposited top insulating layer, a sputtering technique such as that described in U.S. Pat. No. 5,270,264, entitled "Process for Filling Submicron Spaces with Dielectric", can be used to remove some of the insulating material from the breadloaf edges and redeposit that material in the gap. For example, an argon sputter etch of the substrate illustrated in FIG. 6b, at a pressure between approximately 20 and 500 mTorr and a power between approximately 50 and 1000 W, can result in a redistribution of approximately 50 A to 500 A of the insulating layer material as illustrated in FIG. 6d. Although the use of a PECVD deposition for the bottom insulating layer adds this sputter step to the process flow, the overall process complexity can be reduced because the PECVD of the bottom insulating layer, the argon sputter, and the PECVD of a yet to be described top insulating layer can all be performed in a single operation, with each step taking place in a separate chamber of the same piece of equipment, for example an Applied Materials Precision 5000 (AMAT P5000) system.

Furthermore, by enabling the use of PECVD for bottom insulating layer 400, the present invention has the further advantage that it provides for the elimination of the densification step described in the background section. In other words, bottom insulating layer 400 can be undensified, meaning that it has not been subjected to a thermal process with the goal of driving out moisture. PECVD provides a drier oxide than atmospheric or subatmospheric CVD, therefore no densification step is needed to drive out moisture. In addition to reducing the process complexity, the elimination of the densification step removes a high temperature (typically 500 degrees C to 900 degrees C) operation from the process flow. Therefore, the present invention can be used to decrease device size and increase device performance by limiting junction depths, and can be used to form a dielectric above a metal such as aluminum or a silicide that cannot be subjected to a high temperature. Nevertheless, if a densification of bottom insulating layer 400 is desired, a densification step using well known techniques can be performed within the scope of the present invention. A preferred technique for densification of bottom insulating layer 400 is rapid thermal processing.

Figure 7:
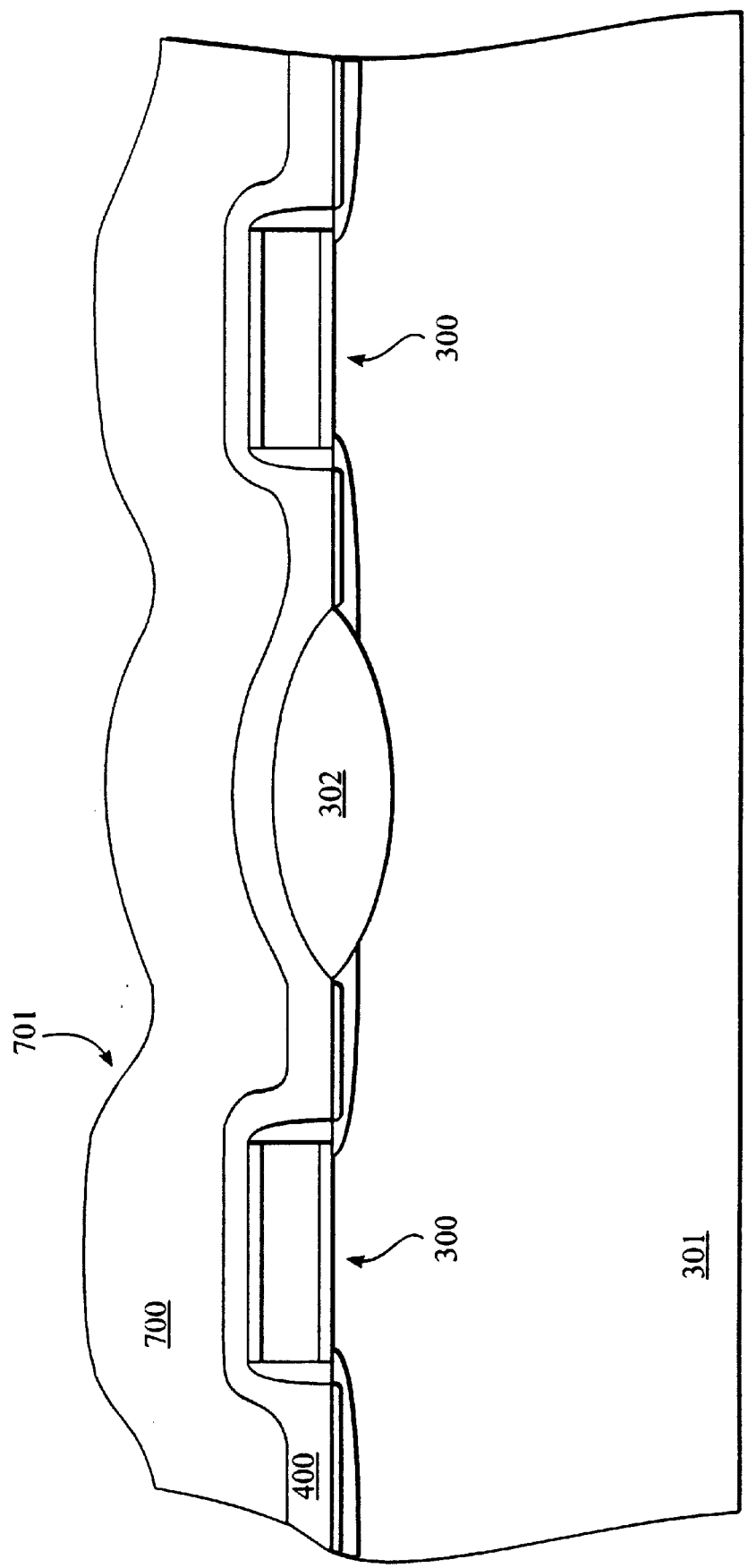
FIG. 7 shows the substrate of FIG. 4 after a top insulating layer has been formed according to one embodiment of the present invention.

Continuing with the process flow of this embodiment, top insulating layer 700, as shown in FIG. 7, is formed directly on top of bottom insulating layer 400. Top insulating layer 700 differs from bottom insulating layer 400 in chemical composition and physical characteristics. First, while bottom insulating layer 400 is doped with phosphorous, there is no need to dope top insulating layer 700 with phosphorous because top insulating layer 700 is separated from devices 300 by bottom insulating layer 400 which comprises sufficient phosphorous for gettering. Second, to allow for the removal of a portion on top insulating layer 700 in a subsequent planarization step, top insulating layer 700 is thicker as deposited than bottom insulating layer 400. Therefore, compared to the prior method of having a thicker bottom insulating layer, with the present invention it is easier to achieve a net compressive stress when using a bottom layer, such as an SACVD oxide, that exerts a tensile stress. An ILD with a net compressive stress is desired because it is less likely to crack. Third, the material of top insulating layer 700 has a lower dielectric constant that of bottom insulating layer 400 to reduce capacitive coupling within and between conductive layers. Since with the present invention bottom insulating layer 400 can be thin enough to allow a portion of the ILD material in the gaps between devices to be the lower dielectric constant material of top insulating layer 700, the present invention can allow for narrower gaps and reduced total area. Finally, top insulating layer 700 is denser than bottom insulating layer 400 so that top insulating layer 700 can serve as a polish stop for a subsequent plug formation process.

Within the chemical and physical constraints listed above, top insulating layer 700 can be any insulating material, such as an oxide. In a preferred embodiment top insulating layer 700 is an undoped silicon dioxide ($SiO_2$) film formed by any conventional or advanced CVD technique. Advanced PECVD techniques such as dual frequency PECVD or high density plasma CVD can be used to provide a denser, more conformal film with a lower dielectric constant. In one embodiment, top insulating layer 700 is formed by TEOS based PECVD in one chamber of an AMAT P5000 after bottom insulating layer 400 has been deposited and sputter etched in the same system. In another embodiment, top insulating layer 700 is an oxide formed by conventional PECVD or high density plasma CVD, with fluorine incorporated to lower the dielectric constant.

The thickness of top insulating layer 700 depends on the height and width of gaps between the underlying devices. Top insulating layer 700 is deposited to be thick enough so that there is sufficient margin for a subsequent planarizing step, and so that it provides sufficient insulating strength after the planarizing step. However, top insulating layer 700 is not so thick as to preclude a manufacturable etch process from penetrating the ILD to form plug holes. Therefore, the preferred deposited thickness of top insulating layer 700 is between approximately 5,000 A and approximately 20,000 A.

As shown in FIG. 7, the top surface 701 of top insulating layer 700 is nonplanar due to the underlying topography created by devices 300 and field oxide regions 302. Such nonplanarity leads to processing problems such as poor resolution in subsequent lithography steps and poor step coverage of subsequent interconnect layers. Therefore, the next step in this exemplary process is performed to increase the planarity of the top surface of top insulating layer 700. In a preferred embodiment, a CMP process is used for this step because it results in a more global planarization than a reflow or etchback process. In one such CMP process, top insulating layer 700 is polished using a slurry containing a mixture of ceria and silica in a basic solution.

Performing CMP on top insulating layer 700 as in the present invention has two major advantages over performing CMP on a phosphorous doped atmospheric or subatmospheric CVD bottom insulating layer as in the prior method. First, top insulating layer 700 is denser than the phosphorous doped film, even if the phosphorous doped film has been densified. The polish rate of a denser film is slower, so the polish is more controllable and more uniform. Second, a typical multilevel metal process has additional CMP steps of ILD layers that are more similar in composition to top insulating layer 700 than to a phosphorous doped layer. Therefore, the CMP of the phosphorous doped layer of the previous method is likely to be a unique process step, whereas the CMP of top insulating layer 700 is likely to be a process step that can be used elsewhere in the same process.

Figure 8:
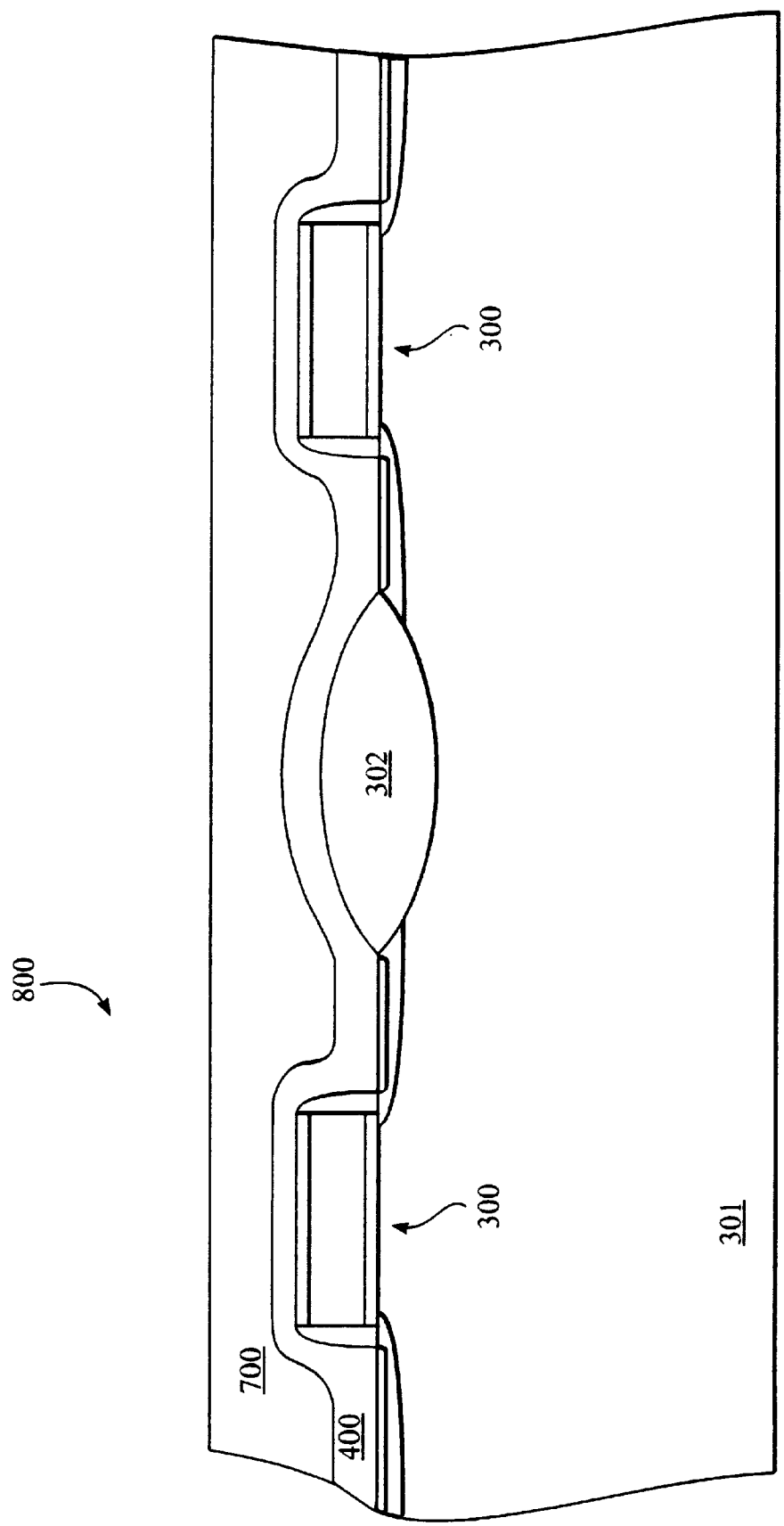
FIG. 8 shows the substrate of FIG. 7 after CMP of the top insulating layer according to one embodiment of the present invention.

FIG. 8 shows the substrate of FIG. 7 after completion of the CMP step. The top surface 800 of top insulating layer 700 is now substantially planar. Top insulating layer 700 is thick enough after CMP to provide sufficient insulating strength between conductive layers, but not so thick as to preclude a manufacturable etch process from penetrating the ILD to form plug holes. Therefore, the preferred thickness of top insulating layer 700 after CMP is between approximately 500 A and approximately 10,000 A.

Figure 9:
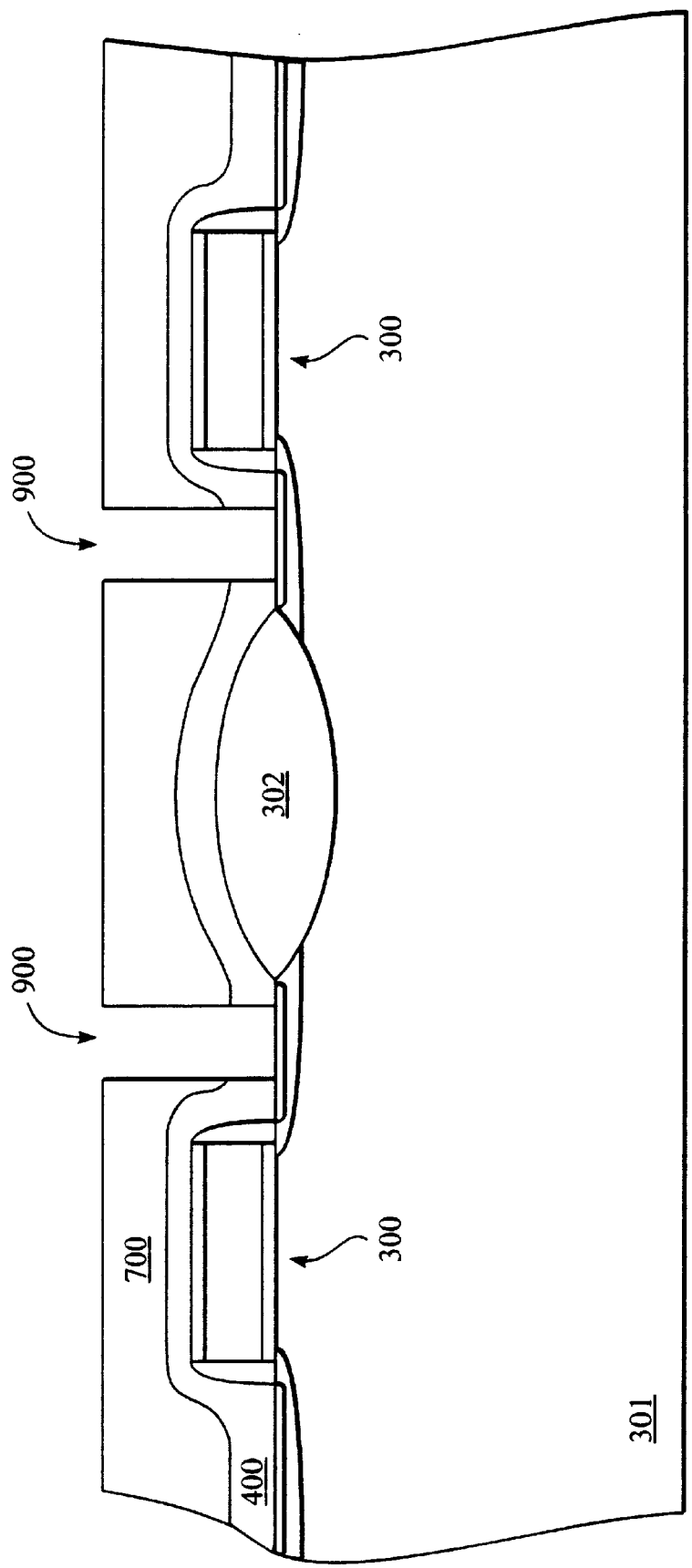
FIG. 9 shows the substrate of FIG. 8 after openings have been formed through the top and bottom insulating layers.

Next, openings 900, as shown in FIG. 9, are formed through top insulating layer 700 and bottom insulating layer 400. Any well known method can be used to form openings 900, such as reactive ion etching with a freon based chemistry.

Figure 10:
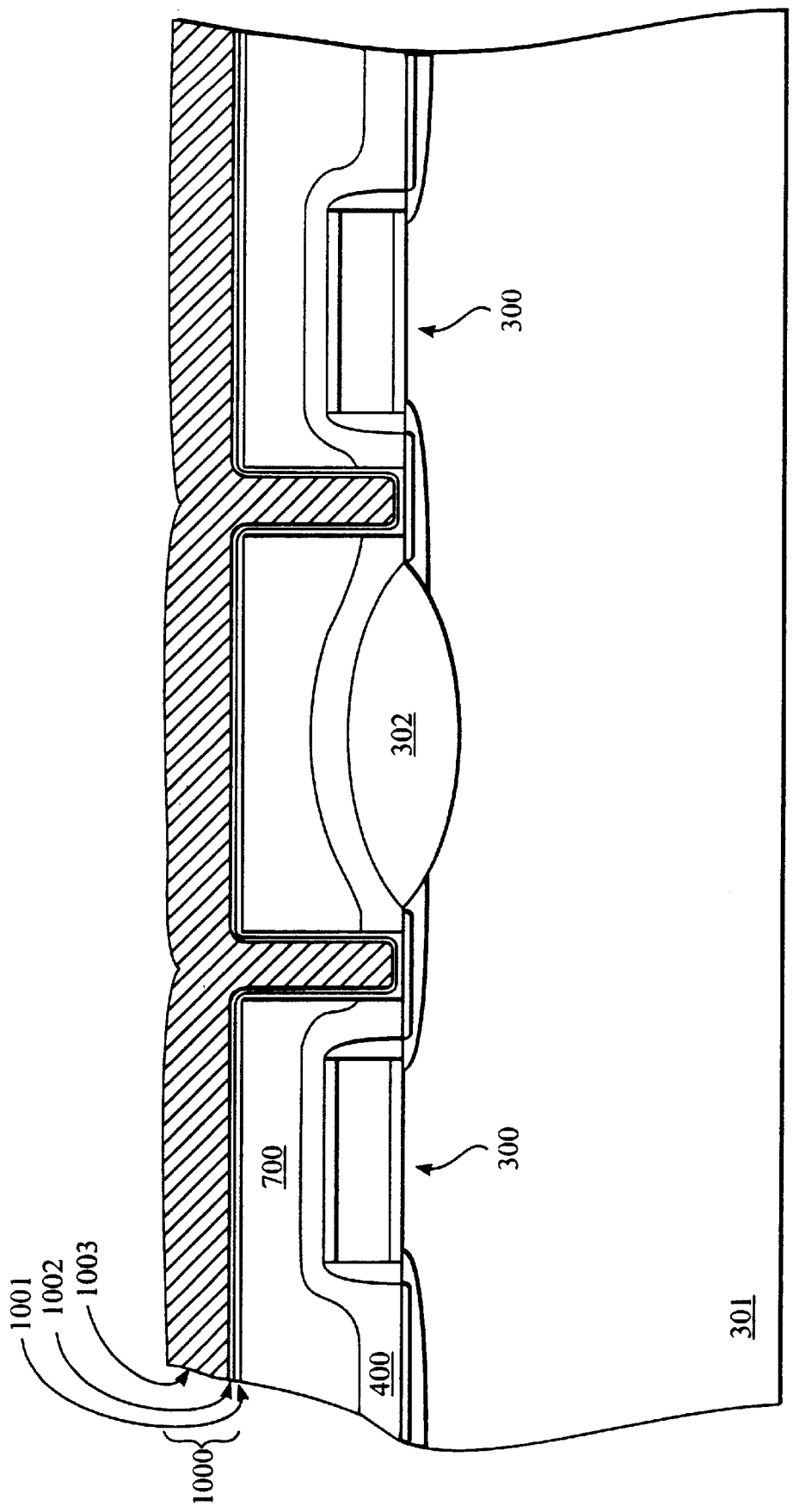
FIG. 10 shows the substrate of FIG. 9 after the openings have been filled by a blanket deposition of a plug layer.

Then, as shown in FIG. 10, openings 900 are filled by a blanket deposition of plug layer 1000. Although plug layer 1000 can be formed with any conductive material, a preferred composition of plug layer 1000 is tungsten over a composite adhesion layer of titanium nitride over titanium. Tungsten is used because it can be formed very conformally allowing for the filling of high aspect ratio openings. The adhesion layer helps the tungsten adhere to top insulating layer 700. A preferred method of forming plug layer 1000 as described above is to first sputter deposit a thin layer (for example, approximately 200 A) of titanium over top insulating layer 700 and along the sidewalls and bottoms of openings 900, forming titanium layer 1001. Then, a thin layer (for example, approximately 600 A) of titanium nitride is sputter deposited over titanium layer 1001 to form titanium nitride layer 1002. Finally, an appropriate thickness (for example, approximately 4800 A) of tungsten is deposited by CVD to form tungsten layer 1003. Although exemplary thicknesses have been given, the actual desired thickness varies depending on process factors such as the dimensions of openings 900. Other plug layer materials and deposition methods can also be used if desired.

Figure 11:
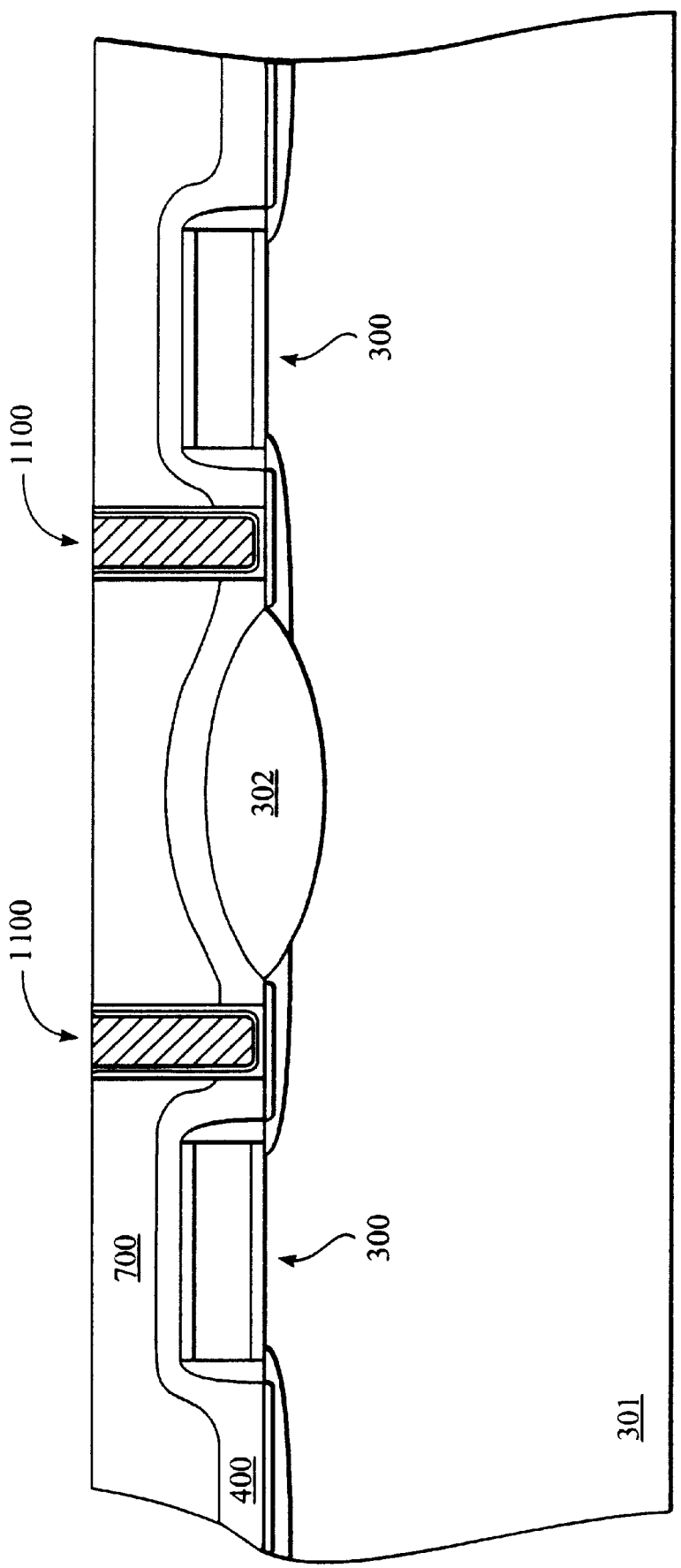
FIG. 11 shows the substrate of FIG. 10 after CMP of the plug layer.

Next, plug layer 1000 is chemically mechanically polished to remove plug layer 1000 from the top surface of top insulating layer 700, thereby forming filled conductive openings, or plugs 1100 as shown in FIG. 11. For the composition of plug layer 1000 described above, a preferred CMP, as described in U.S. Pat. No. 5,340,370, entitled "Novel Slurries for Chemical Mechanical Polishing" and assigned to the present assignee, uses a slurry of approximately 1% to 25% silica, by weight, in approximately 0.01 to 0.3 molar potassium fericyanide for tungsten layer 1003, an approximately 9:1 water diluted version of that slurry for titanium nitride layer 1002, and a slurry of approximately 0.5% silica, by weight, in approximately 0.5 molar potassium fluoride.

During the CMP process of plug layer 1000 some areas will be cleared of plug layer 1000 before other areas because of local variations in film thicknesses, topography, and removal rate. To ensure complete removal of plug layer 1000, an overpolish is used during which substantial areas of the top surface of top insulating layer 700 are subject to the plug CMP process. Therefore, it is important that top insulating layer 700 polish at a rate significantly slower than the rate at which plug layer 1000 polishes. In this way, top insulating layer 700 serves as a polish stop to minimize thinning, dishing, or breakthrough of top insulating layer 700 during the overpolish. The requirement that top insulating layer 700 be denser than phosphorous doped bottom insulating layer 400 allows top insulating layer 700 to serve as an effective polish stop.

Figure 12:
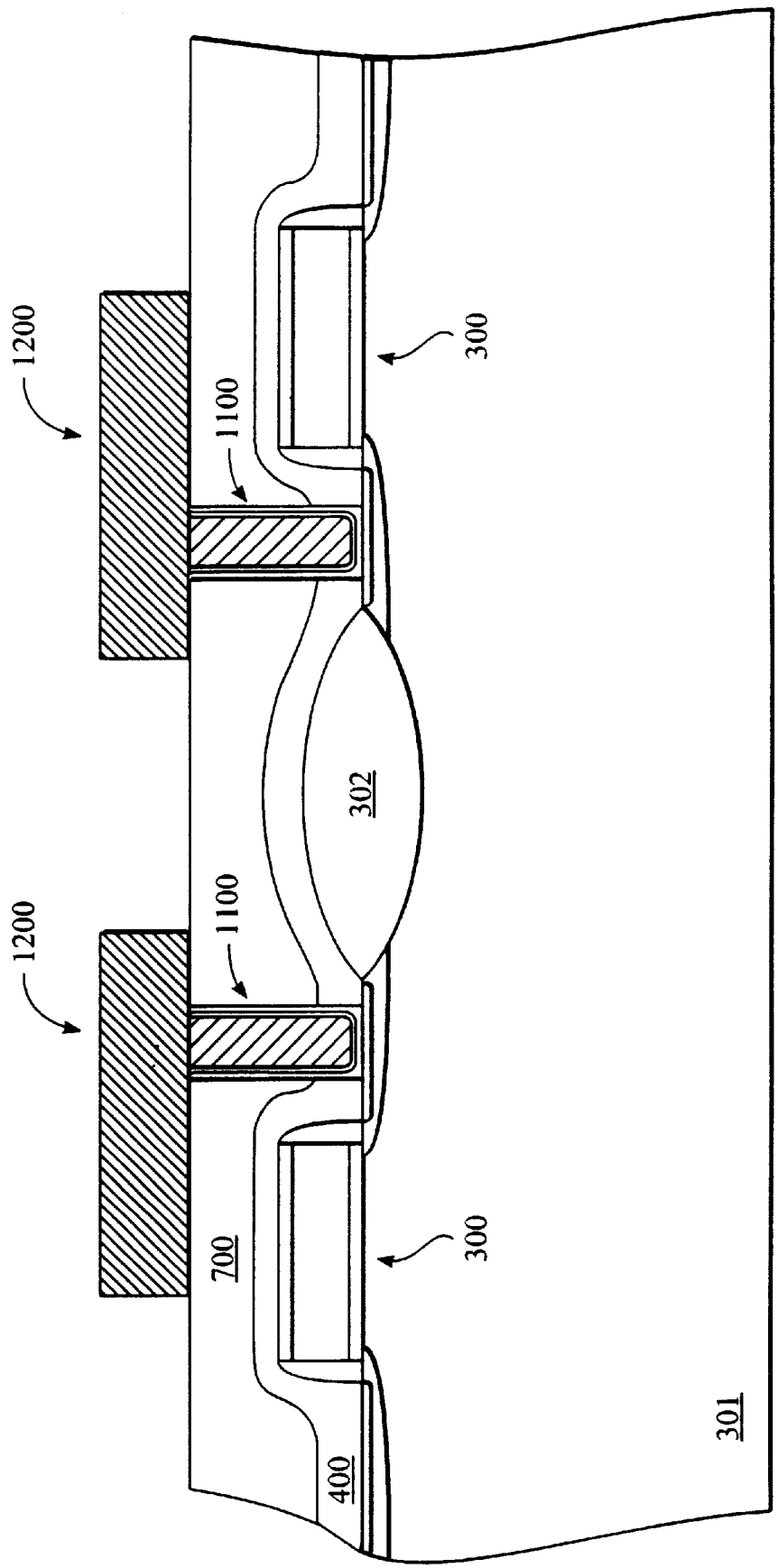
FIG. 12 shows the substrate of FIG. 11 after the formation of interconnects.

Finally, interconnects 1200, as shown in FIG. 12, are formed. Interconnects 1200 is formed by well known means, such as the blanket deposition of an adhesion layer and an aluminum layer over plugs 1100 and top insulating layer 700, followed by the photolithography and etching of the aluminum and adhesion layers. At this point, the interconnection of the semiconductor devices as shown in FIG. 2 is complete.

Figure 13:
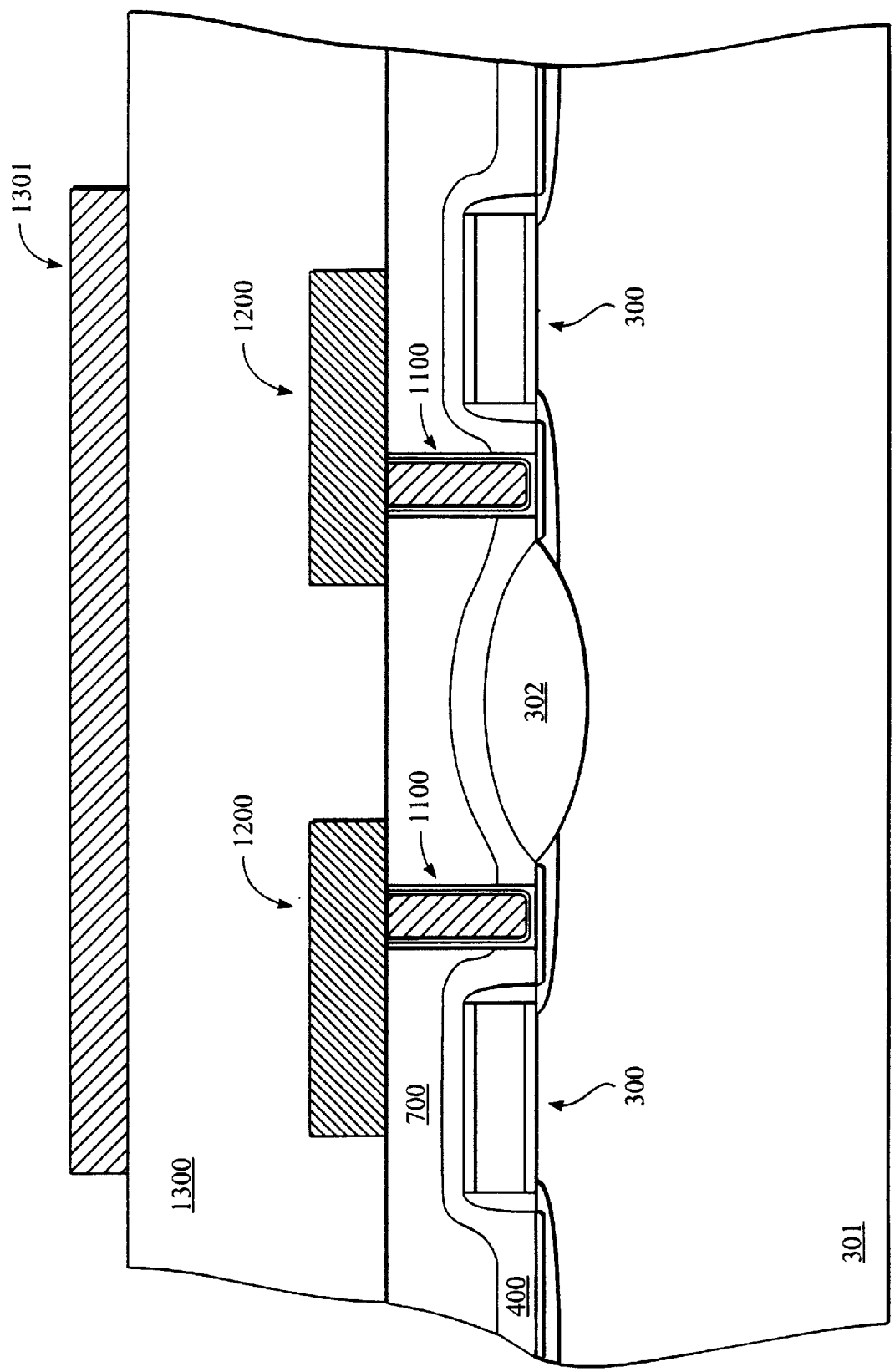
FIG. 13 shows the substrate of FIG. 12 after an ILD has been formed to isolate two levels of interconnects.

As previously described, one advantage of the present invention is that the CMP of top insulating layer 700 need not require a unique process step in a multilevel metal process. For example, as shown in FIG. 13, ILD 1300 isolates interconnects 1200 from interconnect 1301. ILD 1300 can be formed from any insulating material by using any conventional or advanced techniques. In a preferred embodiment ILD 1300 is formed from the same material as top insulating layer 700. The CMP process used to increase the planarity of top insulating layer 700 is also used to increase the planarity of ILD 1300.

What is claimed is:

1. An interlayer dielectric between a layer of semiconductor devices and layer of interconnects comprising:
   a planarized insulating layer; and
   an unplanarized insulating layer comprising phosphorous between said planarized insulating layer and said semiconductor devices, said unplanarized insulating layer being less dense than said planarized insulating layer.

2. The interlayer dielectric of claim 1, further comprising a layer of silicon nitride between said semiconductor devices and said unplanarized insulating layer.

3. The interlayer dielectric of claim 1, said unplanarized insulating layer having a higher dielectric constant than said planarized insulating layer.

4. The interlayer dielectric of claim 1, said unplanarized insulating layer comprising between one percent to eight percent phosphorous by weight.

5. The interlayer dielectric of claim 1, wherein the thickness of unplanarized insulating layer is approximately 100 to approximately 5,000 angstroms.

6. The interlayer dielectric of claim 1, wherein the thickness of planarized insulating layer is approximately 500 to approximately 10,000 angstroms.

* * * * *